(12) United States Patent
Kawamura et al.

(10) Patent No.: US 7,823,762 B2
(45) Date of Patent: Nov. 2, 2010

(54) MANUFACTURING METHOD AND MANUFACTURING APPARATUS OF PRINTED WIRING BOARD

(75) Inventors: Yoichiro Kawamura, Ibi-gun (JP); Katsuhiko Tanno, Ibi-gun (JP); Masanori Iriyama, Ibi-gun (JP); Sho Akai, Ibi-gun (JP)

(73) Assignee: IBIDEN Co., Ltd., Ogaki-shi (JP)

( * ) Notice: Subject to any disclaimer, the term of this patent is extended or adjusted under 35 U.S.C. 154(b) by 592 days.

(21) Appl. No.: 11/528,539

(22) Filed: Sep. 28, 2006

(65) Prior Publication Data

US 2008/0078810 A1    Apr. 3, 2008

(51) Int. Cl.
B23K 31/12    (2006.01)
(52) U.S. Cl. ...................................... 228/103
(58) Field of Classification Search .............. None
See application file for complete search history.

(56) References Cited

U.S. PATENT DOCUMENTS

| | | | |
|---|---|---|---|
| 5,282,565 A * | 2/1994 | Melton | 228/180.22 |
| 5,695,667 A * | 12/1997 | Eguchi et al. | 219/388 |
| 7,600,548 B2 * | 10/2009 | Holm et al. | 156/356 |
| 2005/0274770 A1 * | 12/2005 | Henderson, Sr. | 228/41 |
| 2008/0197173 A1 * | 8/2008 | Kitae et al. | 228/180.22 |

FOREIGN PATENT DOCUMENTS

| | | |
|---|---|---|
| JP | 8-64602 | 3/1996 |
| JP | 9-64046 | 3/1997 |
| JP | 10-116927 | 5/1998 |
| JP | 11-274706 | 10/1999 |
| JP | 2001-257225 | 9/2001 |
| JP | 2003-309139 | 10/2003 |

OTHER PUBLICATIONS

U.S. Appl. No. 12/120,046, filed May 13, 2008, Tanno.
U.S. Appl. No. 12/120,076, filed May 13, 2008, Tanno, et al.
U.S. Appl. No. 12/093,436, filed May 12, 2008, Tanno, et al.

* cited by examiner

*Primary Examiner*—Jessica L Ward
*Assistant Examiner*—Steven Ha
(74) *Attorney, Agent, or Firm*—Oblon, Spivak, McClelland, Maier & Neustadt, L.L.P.

(57) ABSTRACT

A solder ball is loaded on a bump having a small height (FIG. 5(B)) and the height of the bump is intensified by melting the solder ball by heating with laser (FIG. 5(C)). Thus, the heights of the bumps are adjusted within a requested allowable range. Because the bump is not removed by heating when the height of the low bump is intensified, the printed wiring board is not subjected to local heat history thereby intensifying reliability of the bump of a printed wiring board.

9 Claims, 20 Drawing Sheets

Fig. 3
(A)
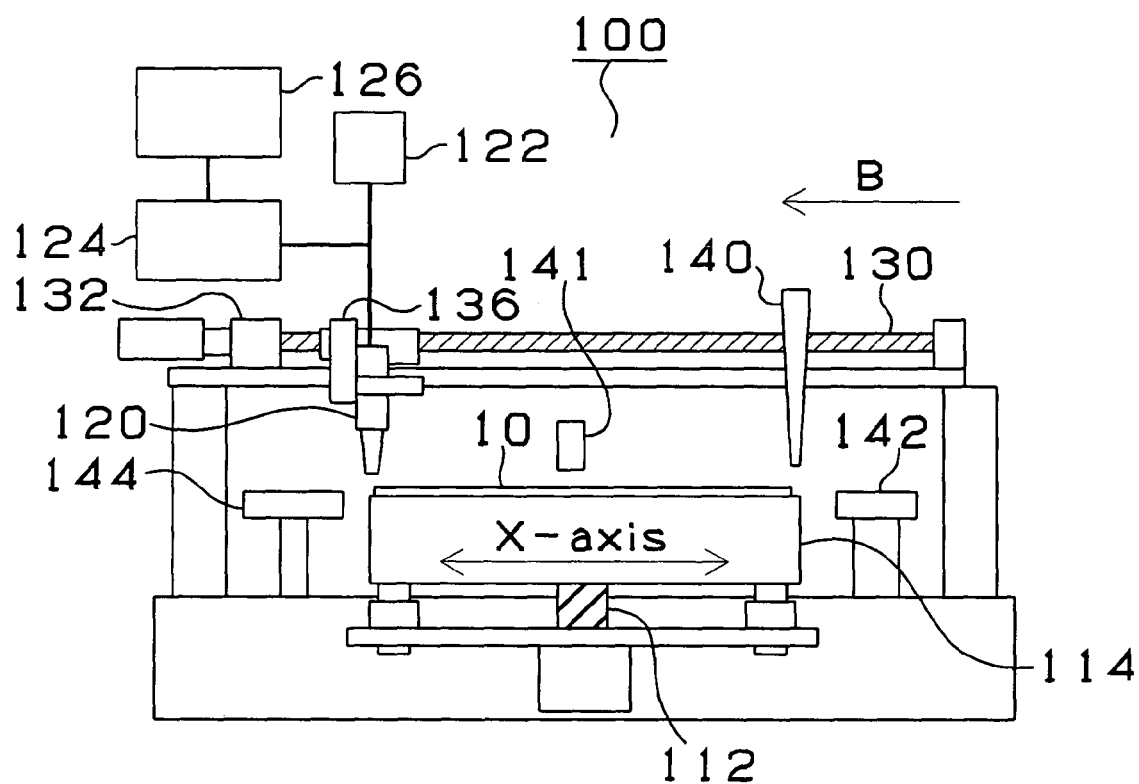
(B)
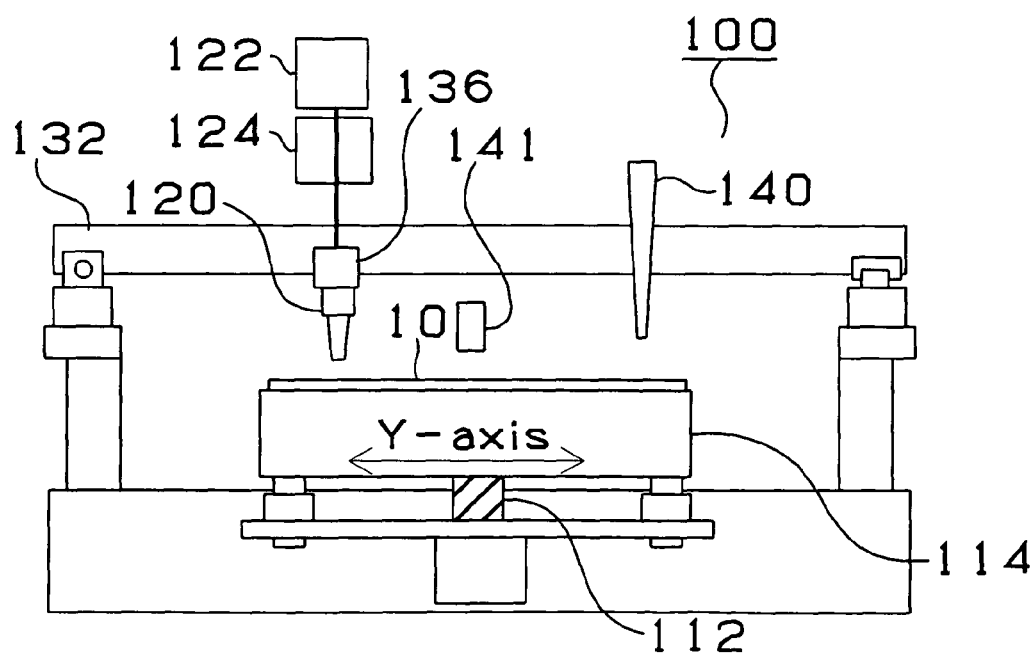

Fig.5
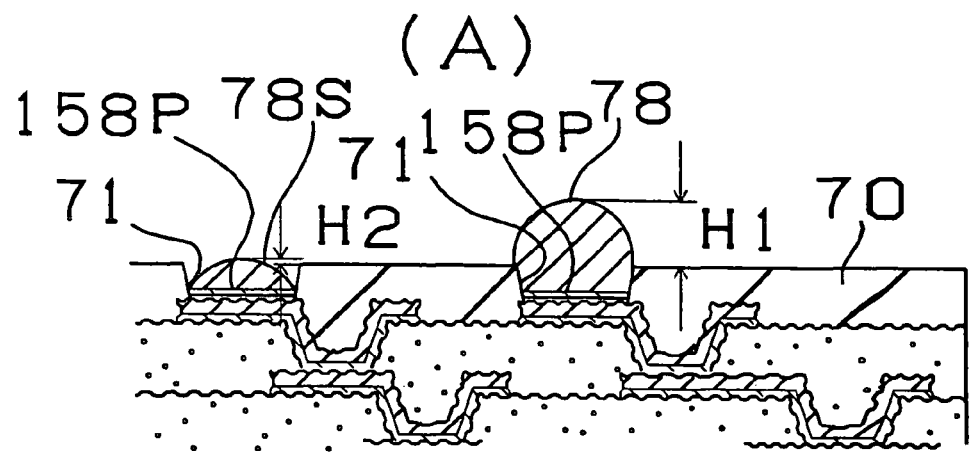
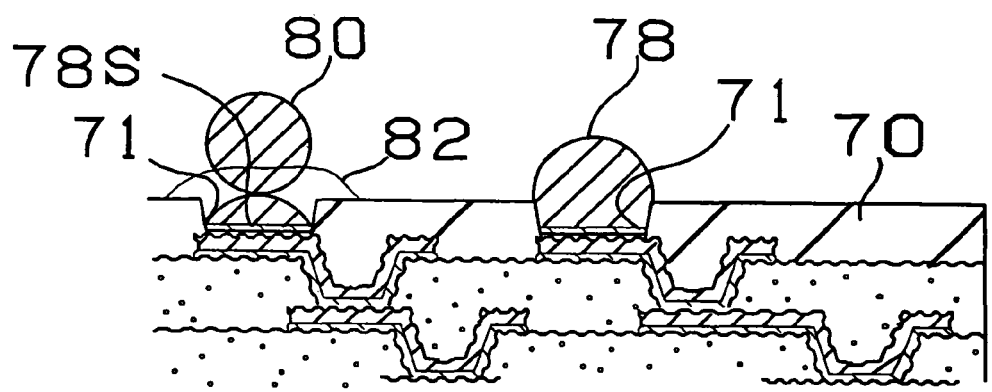
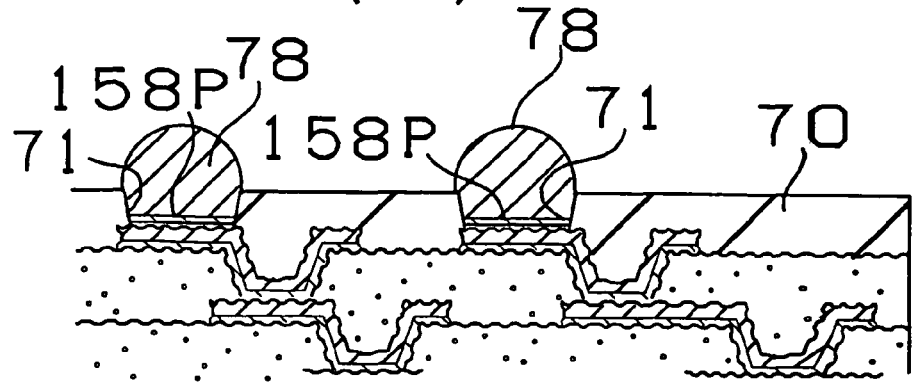

Fig. 6
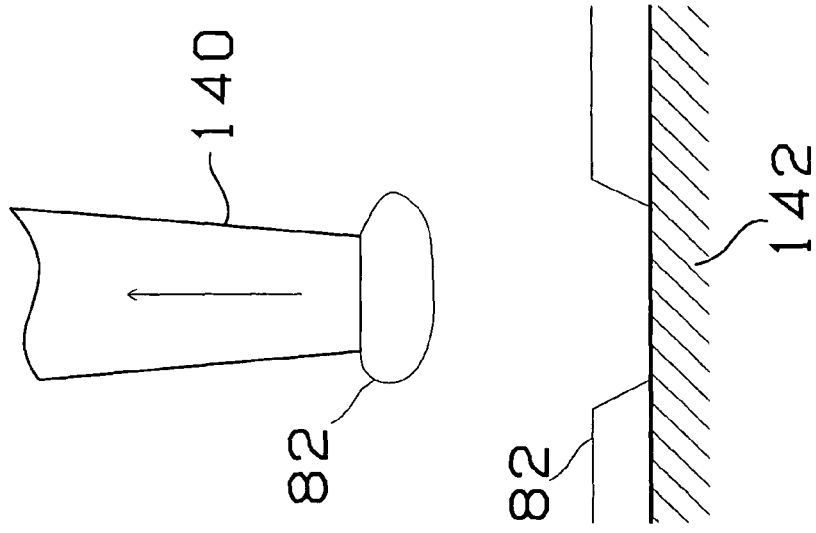
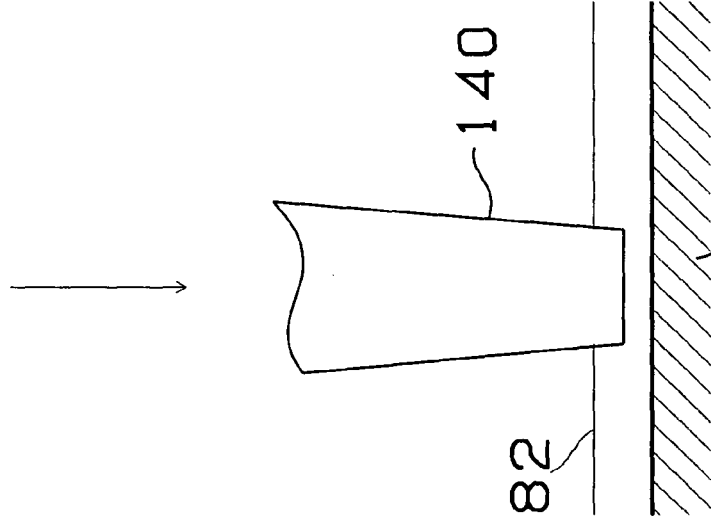
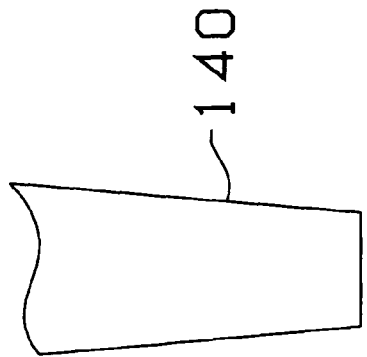

Fig. 7
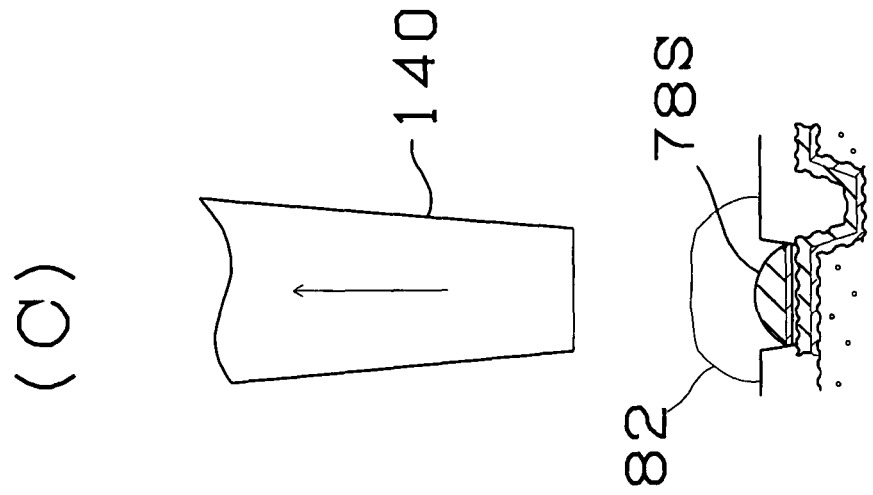
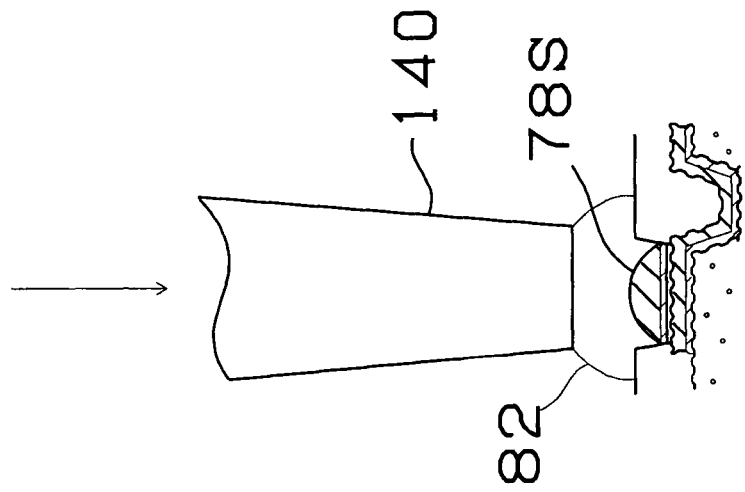
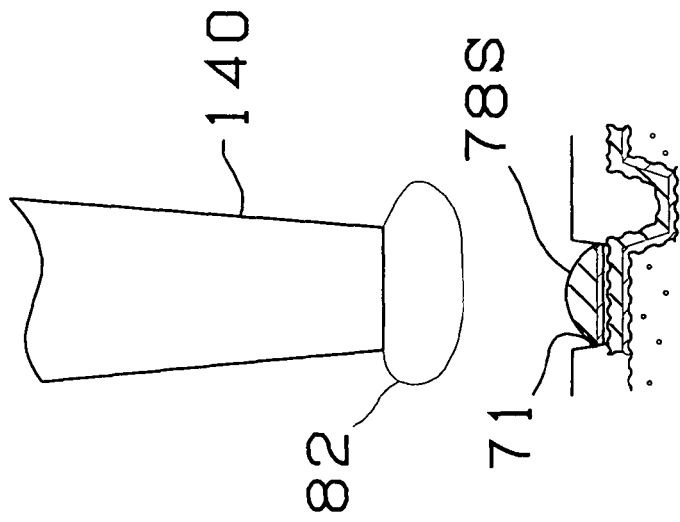

Fig. 18
(A)
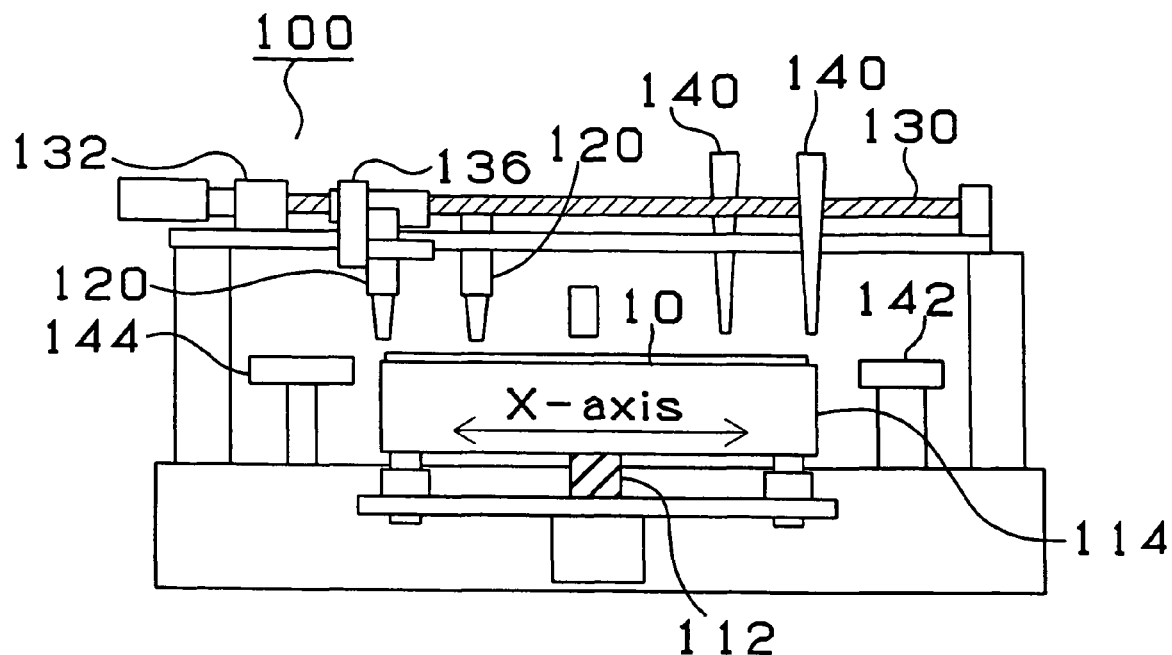
(B)
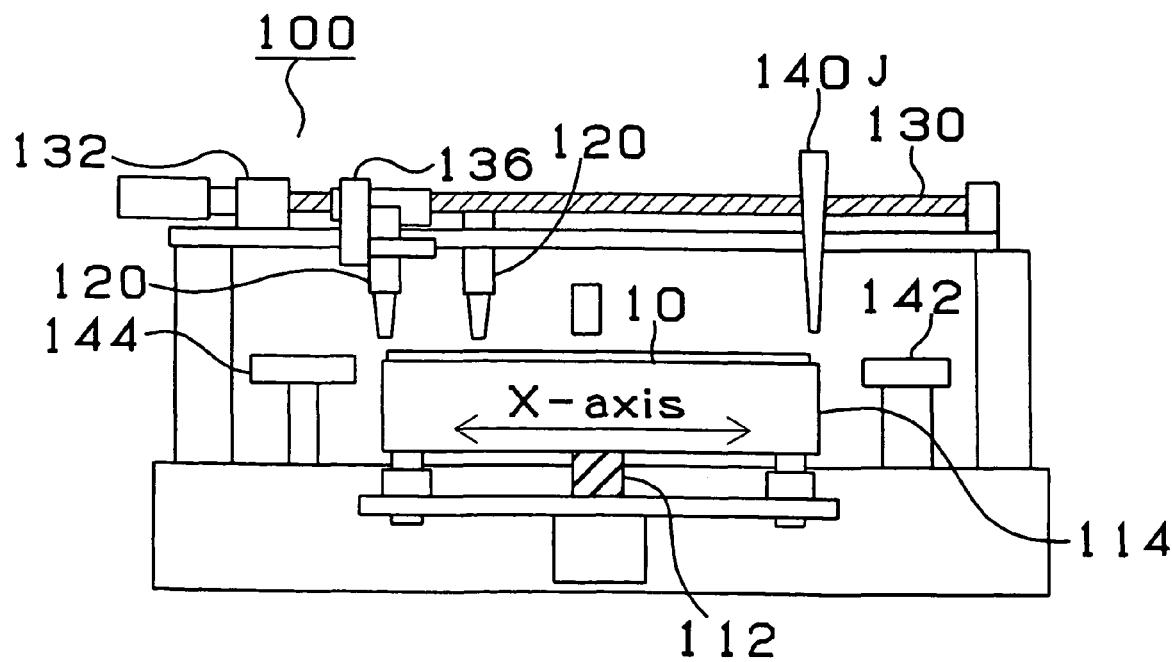

MANUFACTURING METHOD AND MANUFACTURING APPARATUS OF PRINTED WIRING BOARD

BACKGROUND OF THE INVENTION

1. Field of the Invention

The present invention relates to a manufacturing method and manufacturing apparatus of printed wiring board and more particularly to a manufacturing method and manufacturing apparatus of printed wiring board which can be preferably used in a package board on which to mount an IC chip.

2. Description of the Related Art

Solder bumps are used to connect the package board and the IC chip electrically. The solder bumps are formed in following processes.
(1) Process for printing solder paste to a connection pad formed in an opening of solder resist layer of the package board
(2) Process for forming the solder bump from solder paste by reflow.

After the solder bumps are formed on the package board, the IC chip is mounted on the solder bumps and by connecting the solder bumps with pads (terminals) of the IC chip by reflow, the IC chip is mounted on the package board.

Currently, the quantity of solder bumps on the package board for CPU is on the order of several thousands. To allow arrangement of a large number of solder bumps, each solder bump has been miniaturized so that its height is reduced and the allowable range of dispersion of the height has been narrowed. For the reason, the solder bump whose height departs from the allowable range needs to be corrected. Upon this correction, a solder bump having a smaller height is melted and removed and then, a solder bump is formed by loading with solder again as disclosed in JP 2003-309139 A and JP 9-64046 A. According to JP 2001-257225 A, whether or not any abnormality exists in the loaded solder ball is detected before reflow and a solder ball having abnormality is replaced before reflow.

However, as indicated in the JP 2003-309139 A and JP 9-64046 A, if the solder bump having a small height is melted and removed, its conductor pad surface is likely to be damaged when the solder bump is removed and when the bump is formed again, connection reliability between the solder bump and conductor pad can drop. On the other hand, because according to the JP 2001-257225 A, the solder ball is replaced before reflow, if the height of the solder bump is short after reflow, this cannot correspond thereto.

SUMMARY OF THE INVENTION

An object of the present invention is to provide a manufacturing method and manufacturing apparatus of a printed wiring board which enable bumps having a desired height to be formed within a requested allowable range while securing connection reliability between the solder bump and conductor pad.

In order to achieve the above object, a manufacturing method of printed wiring board according to a first aspect, comprising at least steps (a)-(d):
(a) forming bumps by reflow by supplying low melting point metal to openings in solder resist layer;
(b) detecting a bump having a small height or a place in which no bump is formed by measuring heights of formed bumps;
(c) loading a low melting point metal ball to a detected low bump or the place in which no bump is formed so as to adjust the height; and
(d) intensifying the height of the low bump by melting the low melting point metal ball by heating.

According to the manufacturing method of printed wiring board of a first aspect, a low melting point metal ball is loaded on a bump having a small height or a place in which no bump is formed and then, the low melting point metal ball is melted by heating so as to intensify the height of the bump or form a bump. Thus, the heights of the bumps can be adjusted within a requested allowable range. Because when the height of the bump is intensified, a method of adding a low melting point metal ball is adopted instead of removing the bump by heating, conductor pad is not damaged thereby intensifying connection reliability between the bump and pad and further, because the printed wiring board is not subjected to local heat history, reliability of the bump of the printed wiring board can be intensified.

According to the manufacturing method of printed wiring board of a second aspect, the volume of a detected low bump is computed and a low melting point metal ball of a diameter corresponding to the computed volume is selected from low melting point metal balls of plural kinds of diameters and loaded on that low bump. Accordingly, even if very low bumps and slightly low bumps coexist, the heights of all the bumps can be adjusted within a requested allowable range.

According to the manufacturing method of printed wiring board of a third aspect, the volume of the low bump can be obtained accurately by computing from the radius of the solder bump and a height of the solder bump from conductor pad thereby adjusting the heights of all the bumps within the allowable range.

According to the manufacturing method of printed wiring board of a fourth aspect, the height of the detected low bump is measured and the diameter of a low melting point metal ball necessary for adjusting the measured height to a requested height is obtained, a low melting point metal ball having an obtained diameter is selected from low melting point metal balls having plural kinds of the diameters and loaded to the low bump or a place in which no bump is formed. Accordingly, even if very low bumps and slightly low bumps coexist, the heights of all the bumps can be adjusted within a requested allowable range.

According to the manufacturing method of printed wiring board of a fifth aspect, a detected amount line indicating the relation between the bump heights before/after correction and the diameter of a desired low melting point metal ball to be loaded is created and a low melting point metal ball having a predetermined diameter is selected based thereon. Accordingly, the diameter of a low melting point metal ball to be loaded on bumps of various heights can be selected instantly.

According to the manufacturing method of printed wiring board of a sixth aspect, the detected amount line is created corresponding to plural different diameters of openings in solder resist layer. Thus, the diameter of a low melting point metal ball to be loaded on bumps having various opening diameters can be selected instantly.

Because according to the manufacturing method of printed wiring board of a seventh aspect, prior to a step of loading a low melting point metal ball to the low bump or a place in which no bump is formed, the low bump is coated with flux, the low melting point metal ball can be positioned with the flux, so that the bump can be formed at an appropriate position.

Because according to the manufacturing method of printed wiring board of an eighth aspect, the low bump is coated with high viscosity flux prior to loading of low melting point metal ball on the low bump or a place in which no bump is formed, the low melting point metal ball can be positioned with the high viscosity flux so that the bump can be formed at an appropriate position.

Because according to the manufacturing method of printed wiring board of a ninth aspect, the dent is provided by heating the low bump locally prior to loading of the low melting point metal ball on the low bump, the low melting point metal ball can be loaded on the low bump without use of flux so that the bump can be formed at an appropriate position.

Because according to the manufacturing method of printed wiring board of a tenth aspect, melting of the low melting point metal ball with laser is carried out with laser, the frequency of the heat history can be reduced without application of heat to the entire printed wiring board (bump having a normal height)

BRIEF DESCRIPTION OF THE DRAWINGS

FIG. 3(A) is a structure drawing showing the structure of a solder ball loading apparatus according to an embodiment of the present invention and FIG. 3(B) is a drawing of the solder ball loading apparatus of FIG. 3(A) as seen from the side of an arrow B;

FIG. 5 is a process diagram showing a manufacturing method of the multilayer printed wiring board of the first embodiment;

FIG. 6 is a process diagram showing a manufacturing method of the multilayer printed wiring board of the first embodiment;

FIG. 7 is a process diagram showing a manufacturing method of the multilayer printed wiring board of the first embodiment;

FIG. 18(A) is a structure drawing showing the structure of a solder ball loading apparatus of a fifth embodiment and FIG. 18(B) is a structure drawing showing the structure of a solder ball loading apparatus of a sixth embodiment;

DESCRIPTION OF THE PREFERRED EMBODIMENTS

First Embodiment

[Solder Ball Loading Apparatus]

Figure 1:
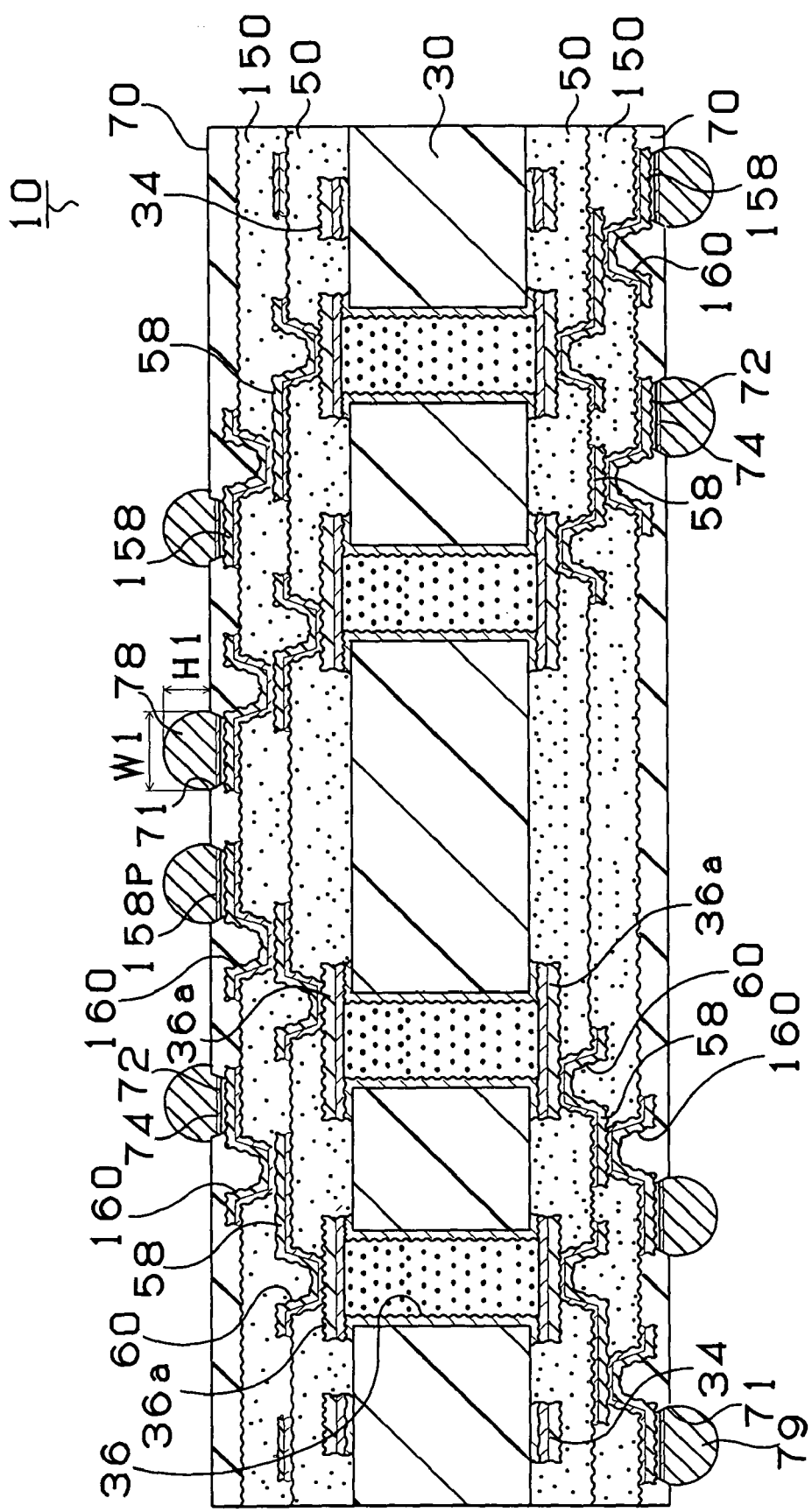
FIG. 1 is a sectional view of multilayer printed wiring board of a first embodiment.

The solder ball loading apparatus for loading minute solder balls (less than 200 μm in diameter) on connection pads of a multilayer printed wiring board will be described with reference to FIG. 3. FIG. 3(A) is a structure drawing showing the structure of a solder ball loading apparatus according to the first embodiment of the present invention and FIG. 3(B) is a drawing of the solder ball loading apparatus of FIG. 3(A) as seen from the side of an arrow B.

The solder ball loading apparatus 100 comprises a Xyθ suction table 114 which positions and holds a multilayer printed wiring board 10, a vertical moving shaft 112 which lifts up and down the XYθ suction table 114, a solder ball loading cylinder 120 for introducing solder ball, a suction unit 124 for applying negative pressure and a pressure to the loading cylinder 120, a laser irradiating unit 122 which irradiates laser for melting solder balls through the loading cylinder 120, an X-direction moving shaft 130 for feeding the loading cylinder 120 in the X-direction, a Y-direction moving shaft 132 for feeding in the Y direction and a Z-direction moving shaft 236 which lifts up and down vertically (Z direction). Additionally, it further comprises an inspection camera 141 for detecting the height of solder bump on the multilayer printed wiring board 10, a solder ball supply unit 144 for supplying solder balls to the side of the loading cylinder 120, a flux carrying cylinder 140 for coating solder bump with flux, and a flux supply plate 142 for supplying flux. The flux carrying cylinder 140 is carried freely along the X, Y, and Z directions by a moving mechanism (not shown). The solder ball loading apparatus 100 is entirely controlled by a control unit 126.

Figure 2:
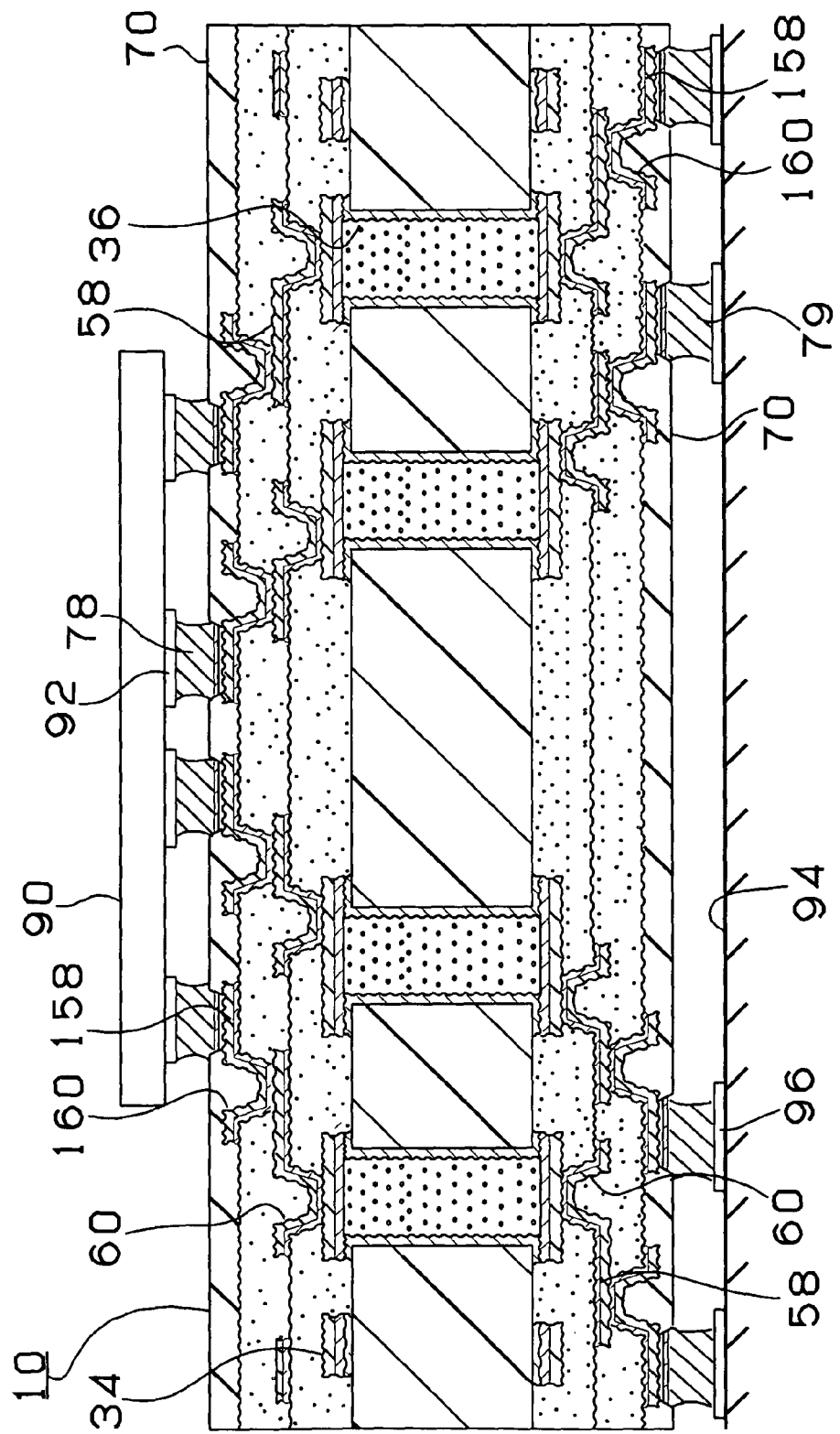
FIG. 2 is a sectional view showing a condition in which an IC chip is mounted on the multilayer printed wiring board shown in FIG. 1.
Figure 4:
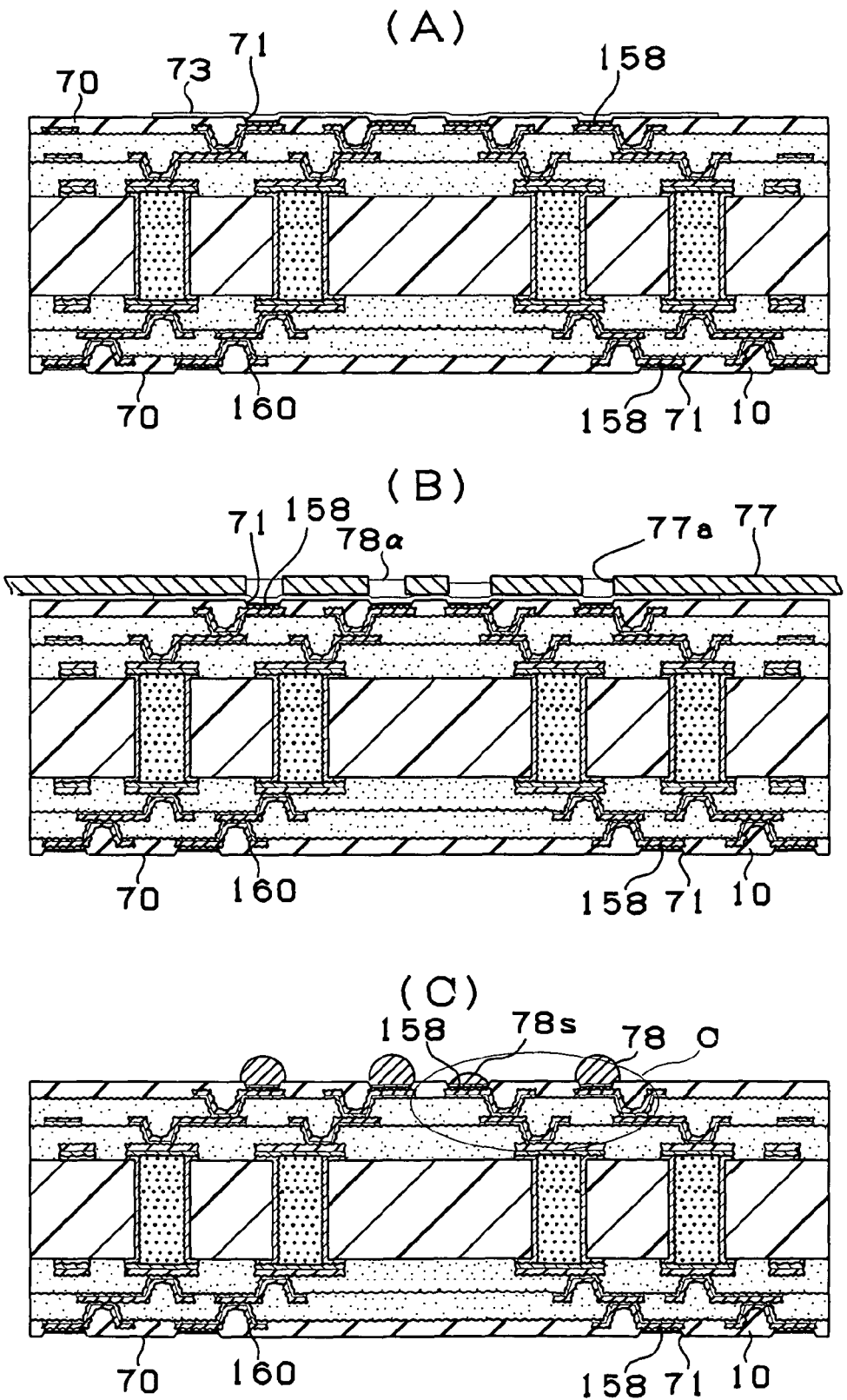
FIG. 4 is a process diagram showing a manufacturing method of the multilayer printed wiring board of the first embodiment.
Figure 8:
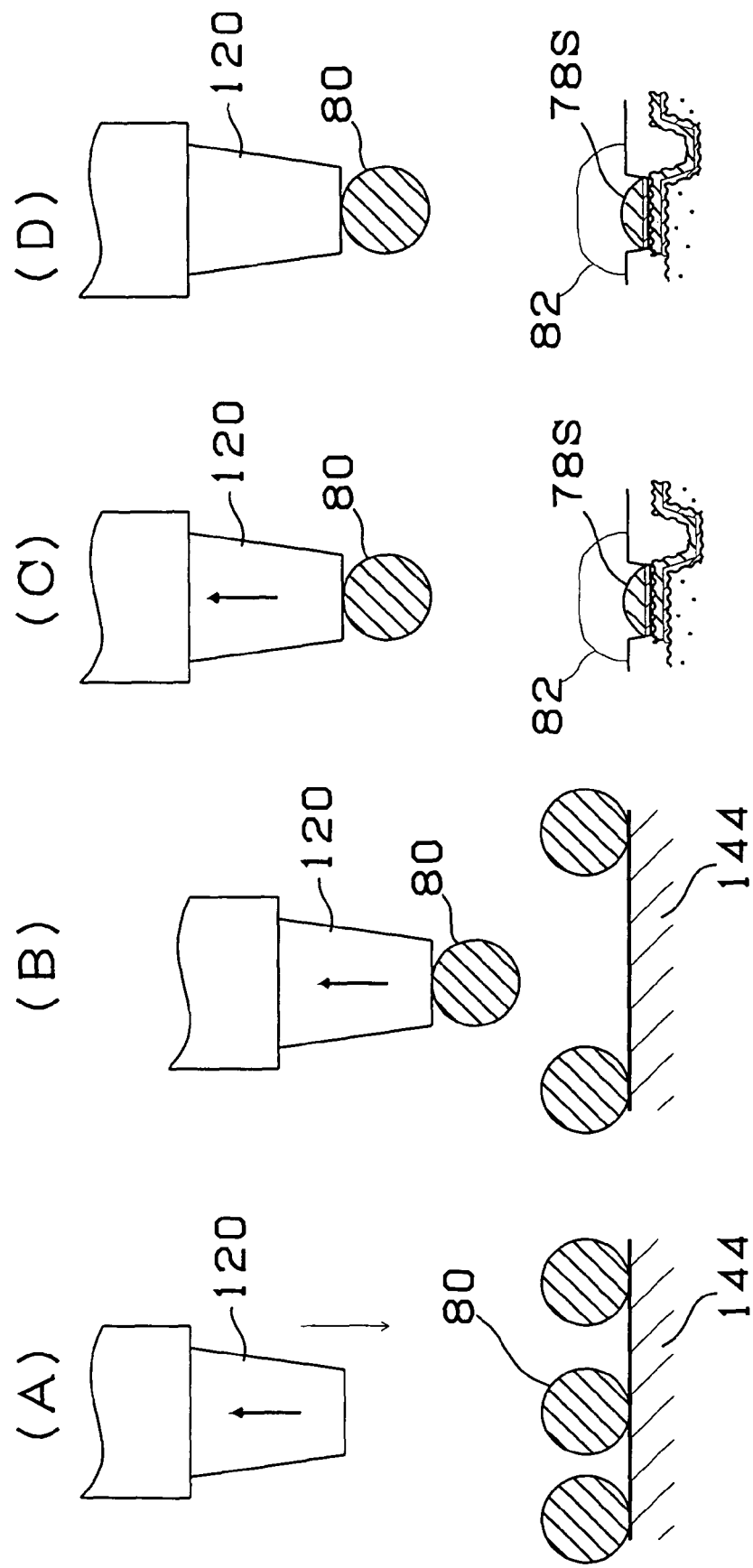
FIG. 8 is a process diagram showing a manufacturing method of the multilayer printed wiring board of the first embodiment.
Figure 9:
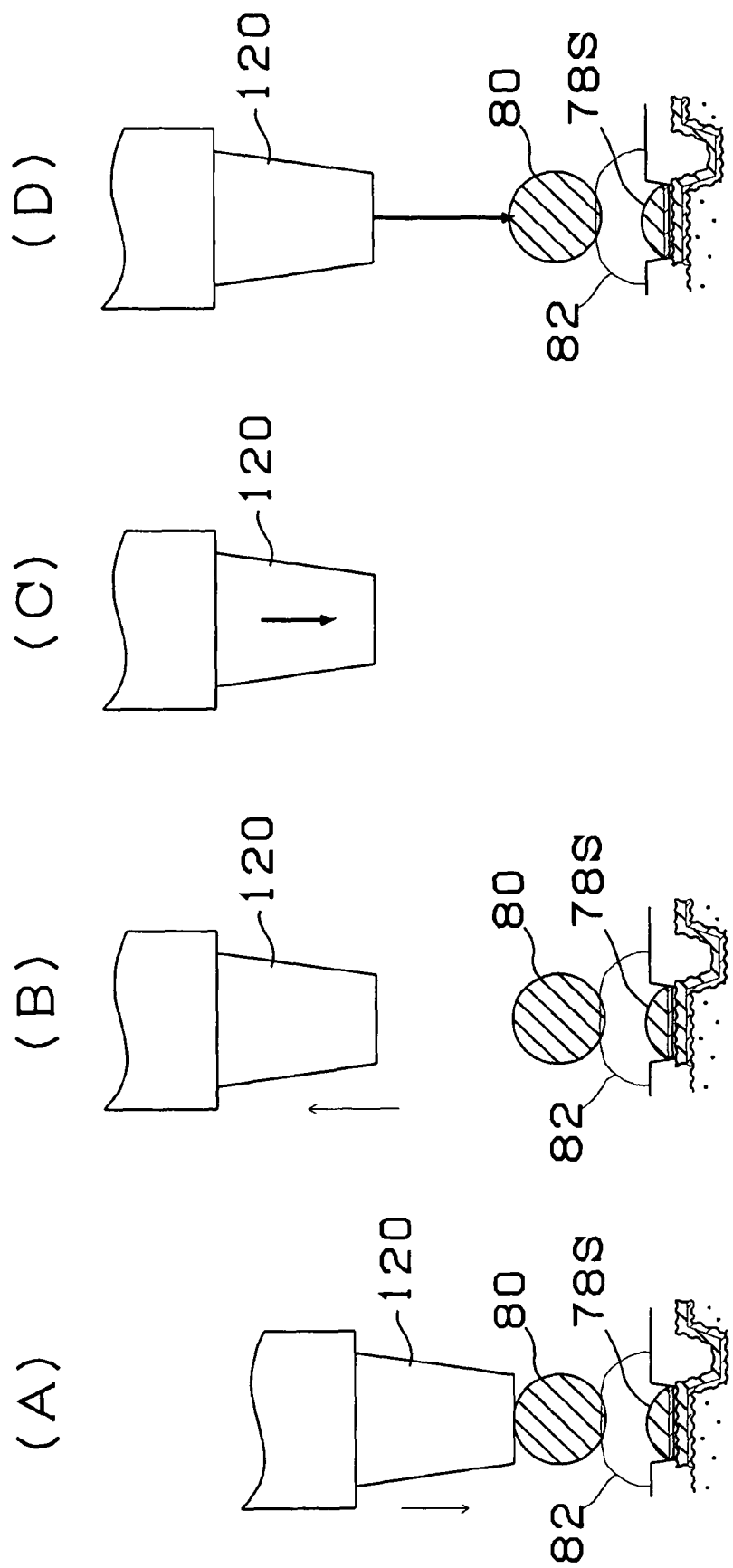
FIG. 9 is a process diagram showing a manufacturing method of the multilayer printed wiring board of the first embodiment.
Figure 10:
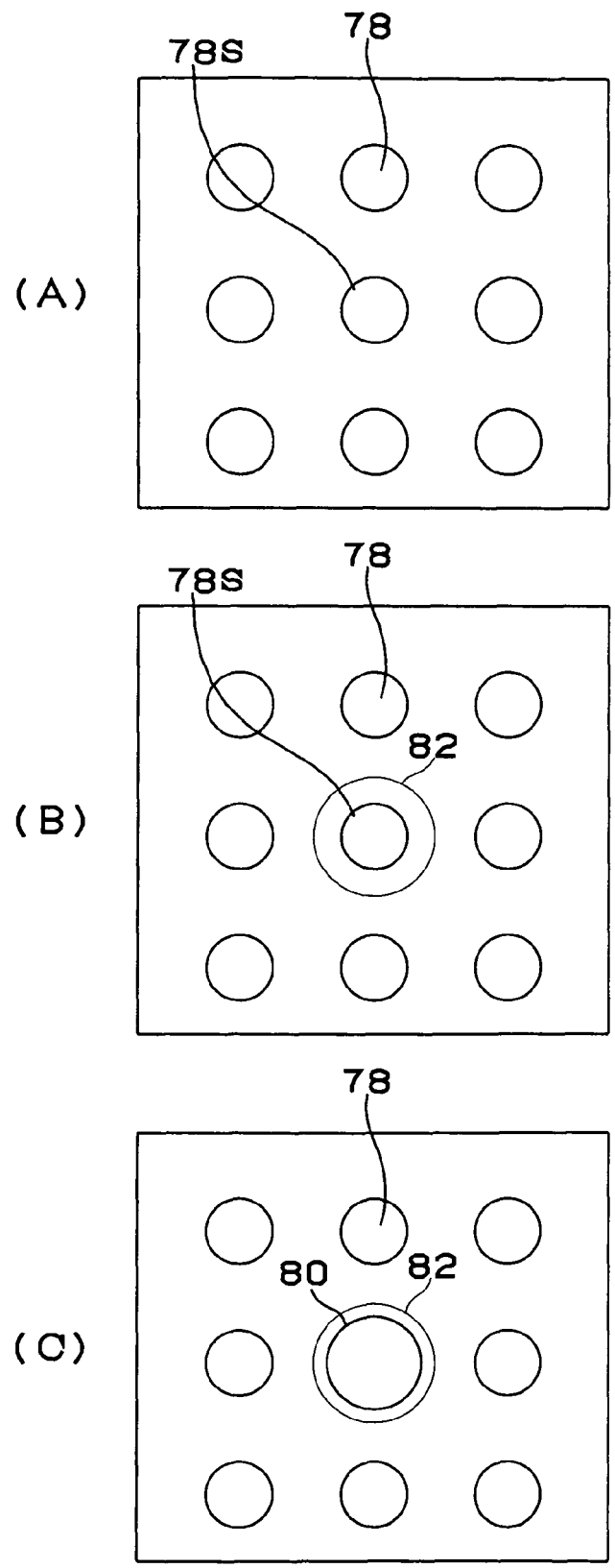
FIG. 10(A) is a plan view of solder bump 78S and solder bump 78 before coating with flux.
FIG. 10(B) is a plan view showing a condition after the surrounding of the solder bump 78S is coated with flux 82.
FIG. 10(C) is a plan view after solder balls 80 are loaded.

Next, the structure of the multilayer printed wiring board 10 according to the first embodiment of the present invention will be described with reference to FIGS. 1, 2. FIG. 1 is a sectional view of the multilayer printed wiring board 10 and FIG. 2 shows a condition in which an IC chip 90 is mounted on the multilayer printed wiring board 10, which is placed on a daughter board 94. As shown in FIG. 1, conductor circuit 34 is formed on the surface of a core substrate 30 on the multiplayer printed wiring board 10. The front surface and rear surface of the core substrate 30 are connected through lands 36a of through holes 36. Interlayer resin insulation layer 50 in which via holes 60 and conductor circuit 58 are formed and interlayer resin insulation layer 150 in which via holes 160 and conductor circuit 158 are formed are disposed on the core substrate 30. Solder resist layer 70 is formed above the via holes 160 and conductor circuit 158. Openings 71 having W1=about 90 µm in diameter are formed in the upper side of the solder resist layer 70 and solder bumps 78 are provided. Nickel plating film 72 and gold plating film 74 are formed in the openings 71. The height H1 (height of projection from the front surface of the solder resist layer) of the solder bump 78 is set to about 20-30 µm. Solder bumps 79 are formed on the bottom surface of the multilayer printed wiring board through the openings 71 in the solder resist layer 70.

As shown in FIG. 2, the solder bumps 78 on the upper side of the multilayer printed wiring board 10 are connected to electrode pads 92 of the IC chip 90. On the other hand, the solder bumps 79 on the bottom side are connected to lands 96 of the daughter board 94.

Subsequently, the manufacturing method of the multilayer printed wiring board 10 described above with reference to FIG. 1 will be described with reference to FIGS. 4-10.

(1) First, flux (viscosity 3000 Pa·s) 73 is applied to the solder resist layer 70 of the multilayer printed wiring board 10 (FIG. 4(A)).

(2) Next, solder paste 78*a* composed of Sn/Pb solder is printed through a mask 77 having openings 77*a* corresponding to the opening 71 in the solder resist layer 70 (FIG. 4(B)).

(3) Solder bump 78 is formed by melting the solder paste 78*a* by reflow (FIG. 4(C)). A portion surrounded by a circle C in FIG. 4(C) is shown in FIG. 5(A). Here, solder bump 78 of a specified height (H1=about 30 µm) and solder bump 78S lower than the specified height (for example, height H2=about 5 µm) are formed due to unevenness or the like of print amount of the solder paste 78*a*. The solder bump 78 and solder bump 78S are corrected by detecting with an inspection camera 141 described above with reference to FIG. 3.

Figure 11:
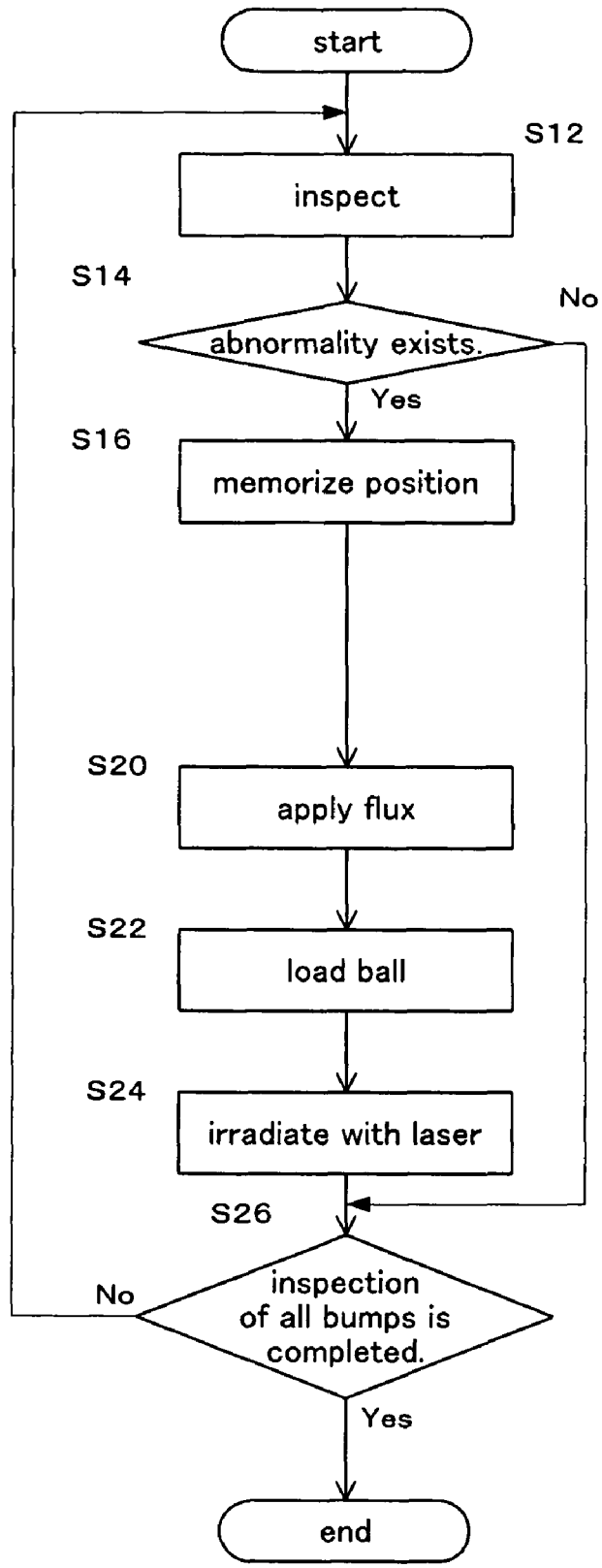
FIG. 11 is a flow chart showing correction processing of solder bump with the solder ball loading apparatus of the first embodiment.

This correction processing will be described with reference to the flow chart of FIG. 11. First, whether or not there is any solder bump lower than the specified height is inspected with the inspection camera 141 (S12), and if there is any solder bump (or solder bump not yet formed) lower than the specified height (S14: Yes), the position of the solder bump 78S is memorized (S16). After the solder bumps 78S are coated with flux 82 as shown in FIG. 5(B) (S20), the solder balls 80 are loaded (S22). At this time, the solder balls 80 are temporarily fixed to the solder bumps 78S through flux 82. After that, the solder bumps 78 of the specified height are formed as shown in FIG. 5(C) by melting the solder balls 80 by irradiating laser thereto with the laser irradiating unit 122 (see FIG. 3) (S24). Then, the procedure is returned to S12 until inspection of all the solder bumps is ended (S26: No) so as to continue the inspection of the solder bumps and after the inspection of all the solder bumps is completed (S26: Yes), the correction processing is ended.

Here, coating of flux and loading of the solder balls will be described more in detail with reference to FIGS. 6-10. The flux carrying cylinder 140 described above with reference to FIG. 3 is carried up to above the flux supply plate 142 (see FIG. 6(A)). The flux carrying cylinder 140 applies flux by making contact without suction or the like. The surface of the flux supply plate 142 is coated uniformly with low volatility flux 82 having a viscosity higher than the viscosity of flux 73 uniformly applied in FIG. 4(A) (viscosity about 60000 Pa·s) as shown in FIG. 4(A). Although in this embodiment, the flux having viscosity of about 60000 Pa·s is used, preferably, the viscosity is in a range of 60000±20000 Pa·s. Volatility of solvent in flux is restricted in this range so that preferable temporary fixing of the solder balls 80 to the bumps 78S can be achieved. Although the flux may be water soluble, it is desirable to use rosin base flux. Then, the flux carrying cylinder 140 is pressed down to the side of the flux supply plate 142 so as to make the flux 82 adhere to the front end of the flux carrying cylinder 140 (FIG. 6(B)). Then, the flux carrying cylinder 140 is pulled up from the flux supply plate 142 (FIG. 6(C)).

After that, the flux carrying cylinder 140 is moved up to above solder bump 78S lower than the specified height (FIG. 7(A)). The flux carrying cylinder 140 is lowered to the side of the solder bump 78S so as to make flux 82 adhere to the solder bump 78S (FIG. 7(B)). Then, the flux carrying cylinder 140 is pulled up from the solder bump 78S (FIG. 7(C)). FIG. 10(A) is a plan view of the solder bump 78S and solder bump 78 before being coated with flux. FIG. 10(B) is a plan view after flux 82 is applied around the solder bump 78S. As shown in FIG. 10(B), flux 82 is applied around the solder bump 78. If the solder ball 80 is not absorbed by bump 78 nearby when the solder ball 80 is loaded or melted by heating, flux may be applied to the entire surface.

On the other hand, the loading cylinder 120 shown in FIG. 3 is moved up to above the solder ball supply unit 144 and lowered to the side of the solder ball supply unit 144 while sucking air by means of the loading cylinder 120 through the suction unit 124 (FIG. 8(A)) so as to absorb the solder ball 80 with the loading cylinder 120 (FIG. 8(B)). After that, the loading cylinder 120 is moved up to above the solder bump 78S lower than the specified height (FIG. 8(C)) and then, the suction by the loading cylinder 120 is stopped (FIG. 8(D)). In this state, the solder ball 80 does not drop due to static electricity generated between the loading cylinder 120 and the solder ball 80.

The loading cylinder 120 is lowered to the side of the solder bump 78S so as to make the solder ball 80 adhere to the flux 82 on the solder bump 78S (FIG. 9(A)). Then, the loading cylinder 120 is raised from the side of the solder bump 78S (FIG. 9(B)). Because the flux 82 is applied around the solder bump 78 as described above with reference to FIG. 10(B), the solder ball 80 can be loaded appropriately on the flux 82 as shown in FIG. 10(C). Next, after the interior of the loading cylinder 120 is cleaned by discharging air from the loading cylinder 120, laser is irradiated to the solder ball 80 through the loading cylinder 120 so as to melt the solder ball (FIG. 9(D)). After the bump is formed in this way, flattening may be done as required.

According to the manufacturing method of printed wiring board according to the first embodiment, the solder ball 80 is loaded on the bump 78S having a lower height and the solder ball 80 is melted by heating with laser to increase the height of the bump having a lower height. Thus, the height of the bump can be set within the allowable range. Because when the height of the lower bump 78S is increased, the bump is not removed by heating with laser or the like, connection reliability between the bump of the printed wiring board and the conductor pad can be intensified without subjecting the conductor pad to heat history.

Further because according to the manufacturing method of printed wiring board of the first embodiment, the low bump 78S is coated with flux 82 having a high viscosity before the solder ball 80 is loaded on the low bump 78S, the solder ball 80 can be positioned by the high viscosity flux 82 so that the bump can be formed at an appropriate position.

Further, because according to the manufacturing method of printed wiring board of the first embodiment, melting of the solder ball by heating is carried out with laser, heat is not applied to the entire printed wiring board thereby making it possible to reduce the frequency of heat history. Additionally, normal bumps are not affected.

Second Embodiment

In the first embodiment, the height of the solder bump having a small height is intensified by loading another solder bump thereon. Contrary to this, according to the second embodiment, after the volume of the solder bump is determined by measuring the height (quantity of solder) of the solder bump, a relatively large solder ball is loaded on a very low solder bump and a relatively small solder ball is loaded on a slightly low solder bump 78 so that the heights of the solder bumps fall within the narrow allowable range.

Figure 12:
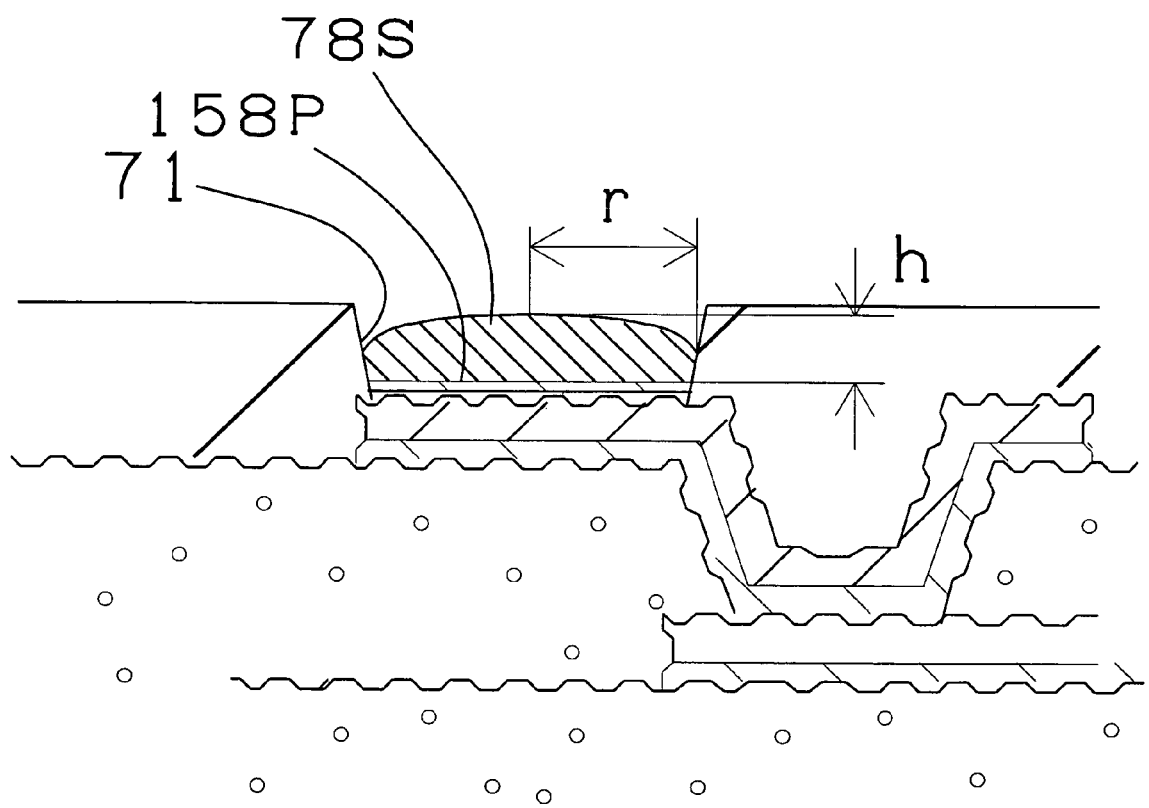
FIG. 12 is an explanatory diagram for explaining a computation method of the volume of the solder bump.

Prior to description of the second embodiment, an example of computation method of the volume of the solder bump will be described with reference to FIG. 12. The volume V when the solder bump 78S is not semi-circular but expanded flatly as shown in FIG. 12 can be obtained according to a following equation where the radius of the solder bump is r and the height thereof from the conductor pad 158P is h:

$$V = \frac{4}{3} \times \pi \times r \times r \times h \times \frac{1}{2}$$ [Equation 2]

Figure 13:
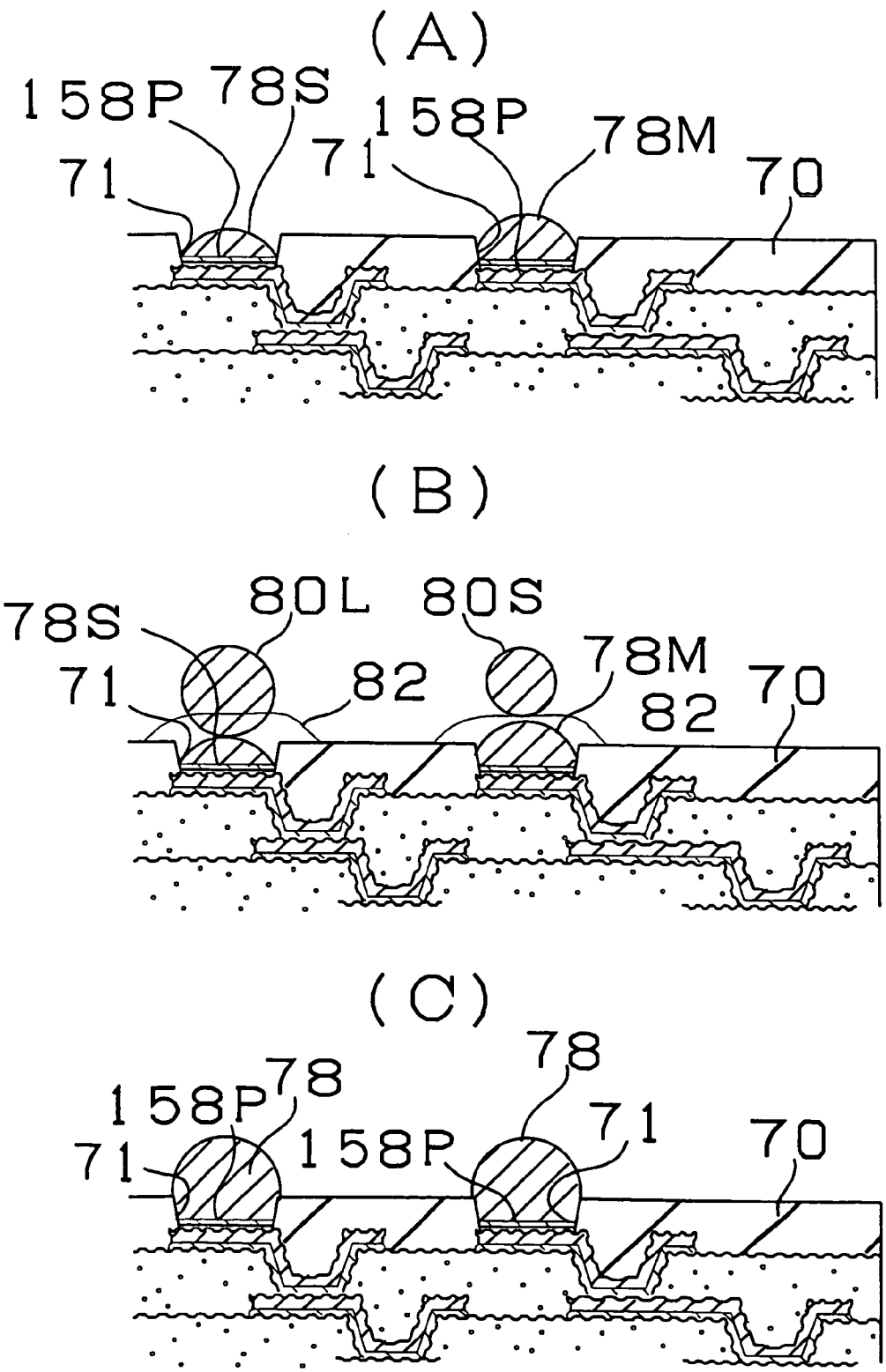
FIG. 13 is a process drawing showing a manufacturing method of multilayer printed wiring board according to a second embodiment.
Figure 14:
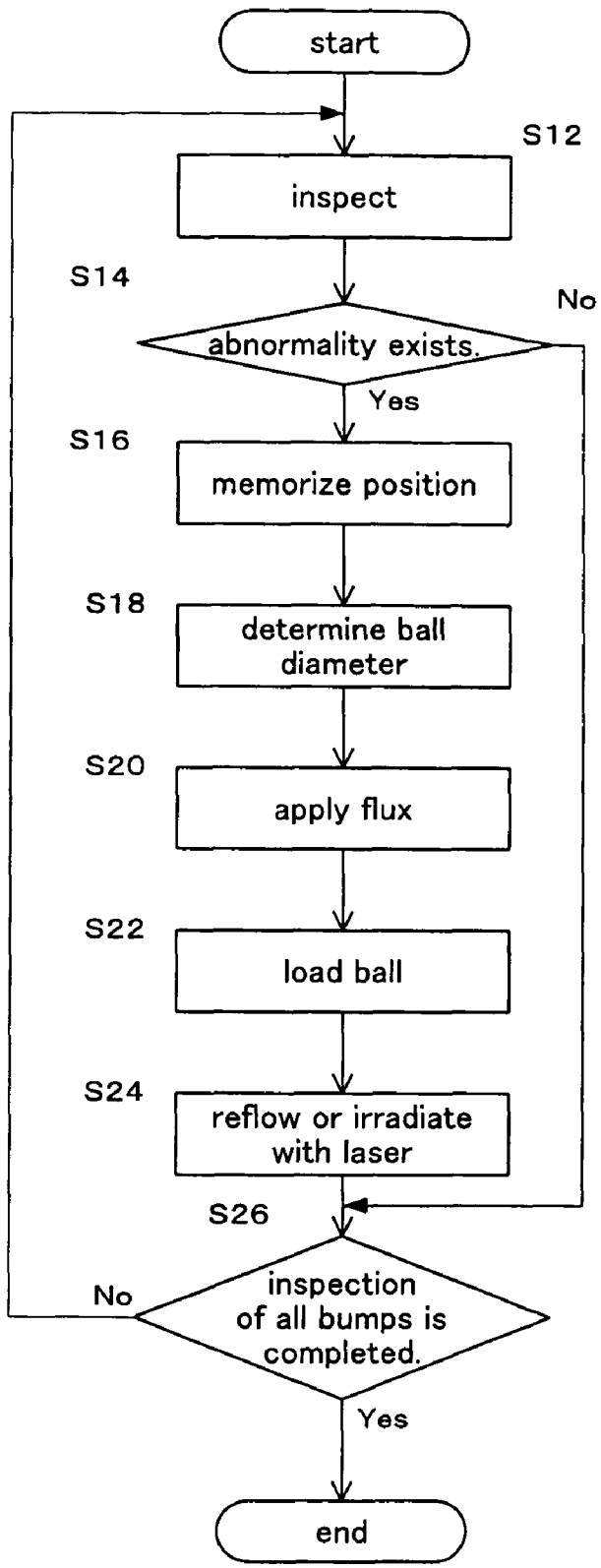
FIG. 14 is a flow chart showing correction processing of solder bump with the solder ball loading apparatus of the second embodiment.

In the second embodiment, solder ball having a diameter corresponding to the volume of an obtained solder bump is selected and loaded. The manufacturing process of the second embodiment will be described with reference to FIG. 13 and the flow chart of FIG. 14 showing that processing.

First, the solder bump is formed by reflow in the same manner as the first embodiment described above with reference to FIG. 4. Here if a solder bump 78S having a very small height is detected as a result of inspection (S12) as shown in FIG. 13(A) (S14: Yes), its position is memorized (S16) and a relatively large solder ball 80L corresponding to the solder bump 78S is selected (S18). After being coated with flux (S20), the solder ball 80L is loaded on the solder bump 78S (FIG. 13(B)). Likewise, if solder bump 78M having a slightly small height is detected as shown in FIG. 13(A) (S14: Yes), its position is memorized (S16) and a relatively small solder ball 80S corresponding to the solder bump 78M is selected (S18). After being coated with flux (S20), the solder ball 80S is loaded on the solder bump 78M (FIG. 13(B)). Description of a following processing is omitted because it is the same as the first embodiment. In the meantime, in the second embodiment, the solder balls are not melted individually but melted in batch by reflow. Although in this second embodiment, the solder balls of two kinds of the diameter are used, solder balls of three or more kinds of the diameter may be used. Further, if openings 71 having plural kinds of the diameters exist in the solder resist layer 71, the solder balls may be selected corresponding to the diameter of the opening as well as the height of the solder bump.

According to the manufacturing method of printed wiring board of the second embodiment, the height of a detected low bump is measured and of solder balls having diameters of plural kinds, a solder ball having a diameter corresponding to the measured height is selected and loaded on the low bump. Thus, even if there coexist very low bumps and slightly low bumps, the heights of all the bumps can be adjusted into a required allowable range. Flattening is permitted as required.

Further, the manufacturing method of printed wiring board of the second embodiment enables the processing to be carried out easily because a large number of the solder balls can be melted at once as melting of the solder ball by heating is executed by reflow. Further, bumps can be formed with laser irradiation.

Third Embodiment

Subsequently, the manufacturing method of printed wiring board according to the third embodiment of the present invention will be described. In the second embodiment, a solder ball corresponding to the volume of a solder ball determined by the equation 1 is selected. Contrary to this, in the third embodiment a detected amount line which indicates the relation between a bump height before correction and a bump height after correction is created preliminarily by means of experiments and simulations for each opening in a predetermined solder resist layer and a solder ball of a suitable system is selected based on this detected amount line at the time of bump correction.

Figure 19:
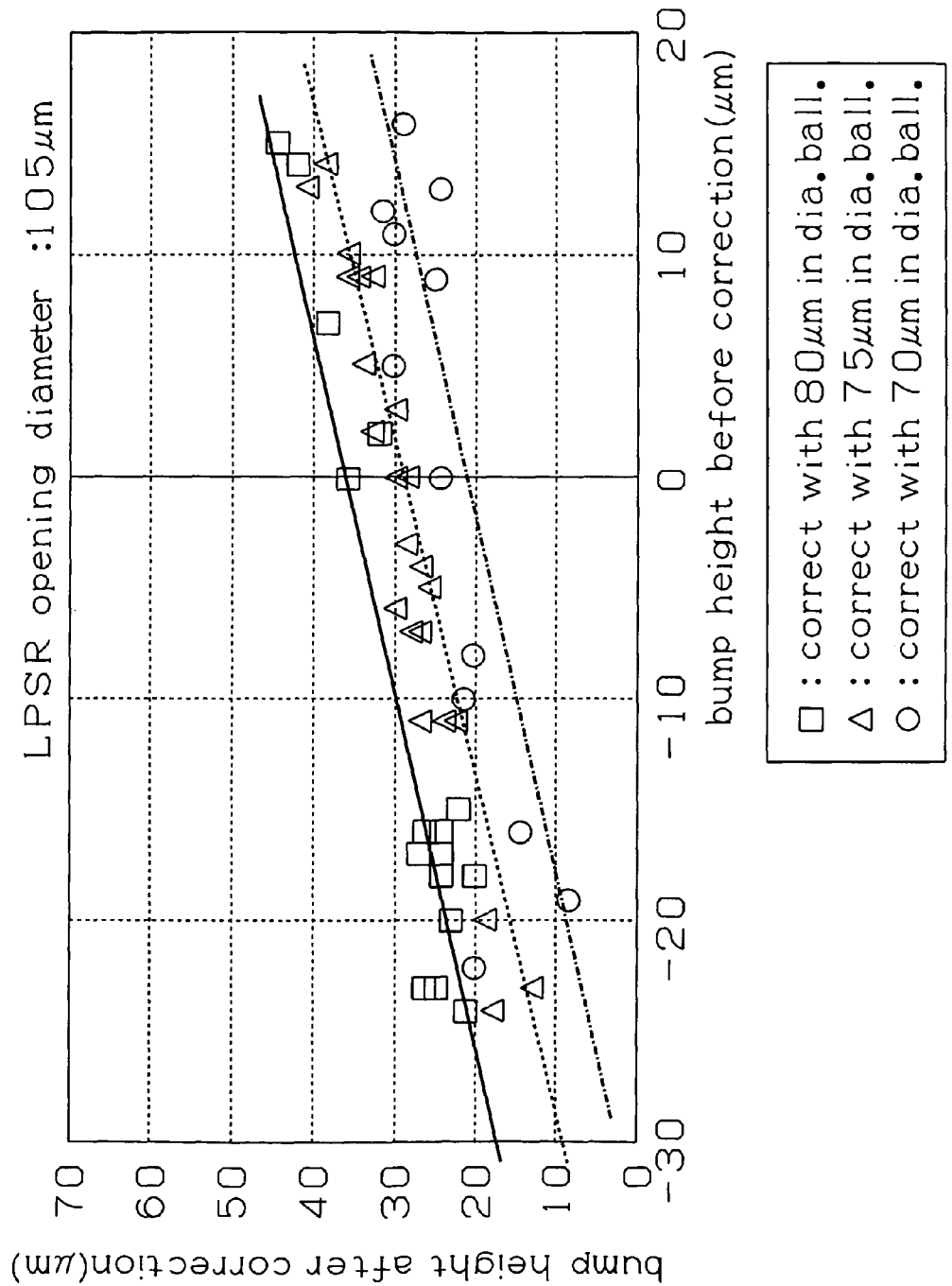
FIG. 19 is a graph showing the relation between solder bump height before correction and solder bump height after correction.
Figure 20:
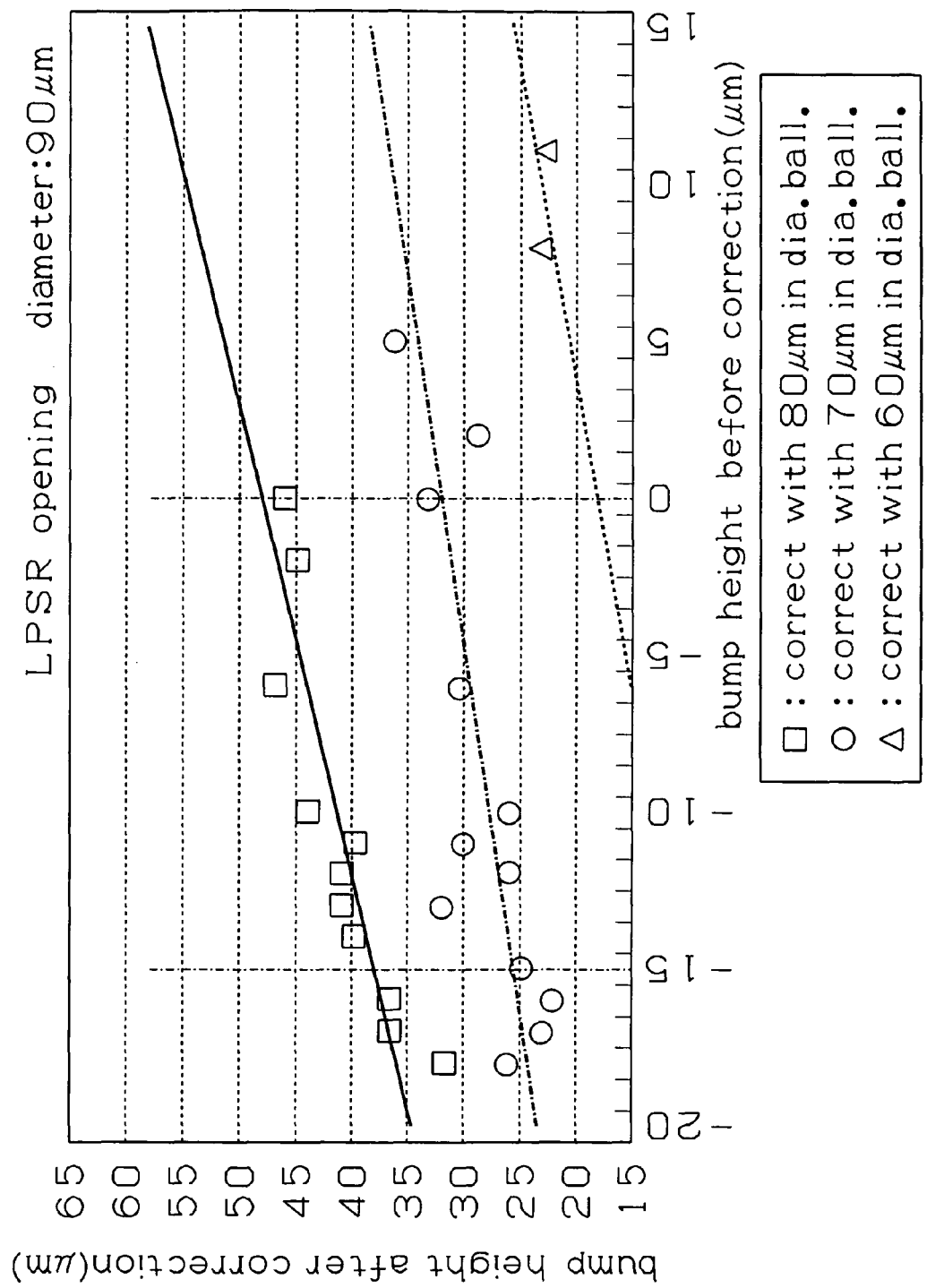
FIG. 20 is a graph showing the relation between solder bump height before correction and solder bump height after correction.

This detected amount line will be described with reference to FIGS. 19, 20. FIGS. 19, 20 are graphs which indicate solder bump height before correction on its abscissa axis and solder bump height after correction on its ordinate axis. FIG. 19 shows results of tests done by correction using solder balls having diameters of 80 μm, 75 μm, 70 μm to an opening having a diameter of 105 μm in the solder resist layer. FIG. 20 shows results of tests done by correction using solder balls having diameters of 80 μm, 70 μm, 60 μm to an opening having a diameter of 90 μm in the solder resist layer. The reason why the abscissa axis has plus and minus is that a case where the solder bump is lower than the surface of the solder resist layer is expressed with minus and that a case where it is higher is expressed with plus. For example, it is evident that bumps existing in a range of minus 20 to plus 10 before correction can be corrected into a range of 20-30 μm in height by using three kinds of the solder balls having diameters of 80 μm, 75 μm, and 70 μm to an opening having a diameter of 105 μm. Likewise, as shown in FIG. 20, it is evident that bumps existing in a range of minus 15 to plus 10 before correction can be corrected into a range of 20-30 μm in height by using two kinds of the solder balls having diameters of 70 μm, 60 μm to an opening having a diameter of 90 μm. Here, a line in the Table obtained from the correction result is a detected amount line. According to the third embodiment, the solder ball loading apparatus described with reference to FIG. 3 possesses the detected amount line as a map so as to obtain a solder ball diameter suitable for the solder bump measured using that map.

Figure 15:
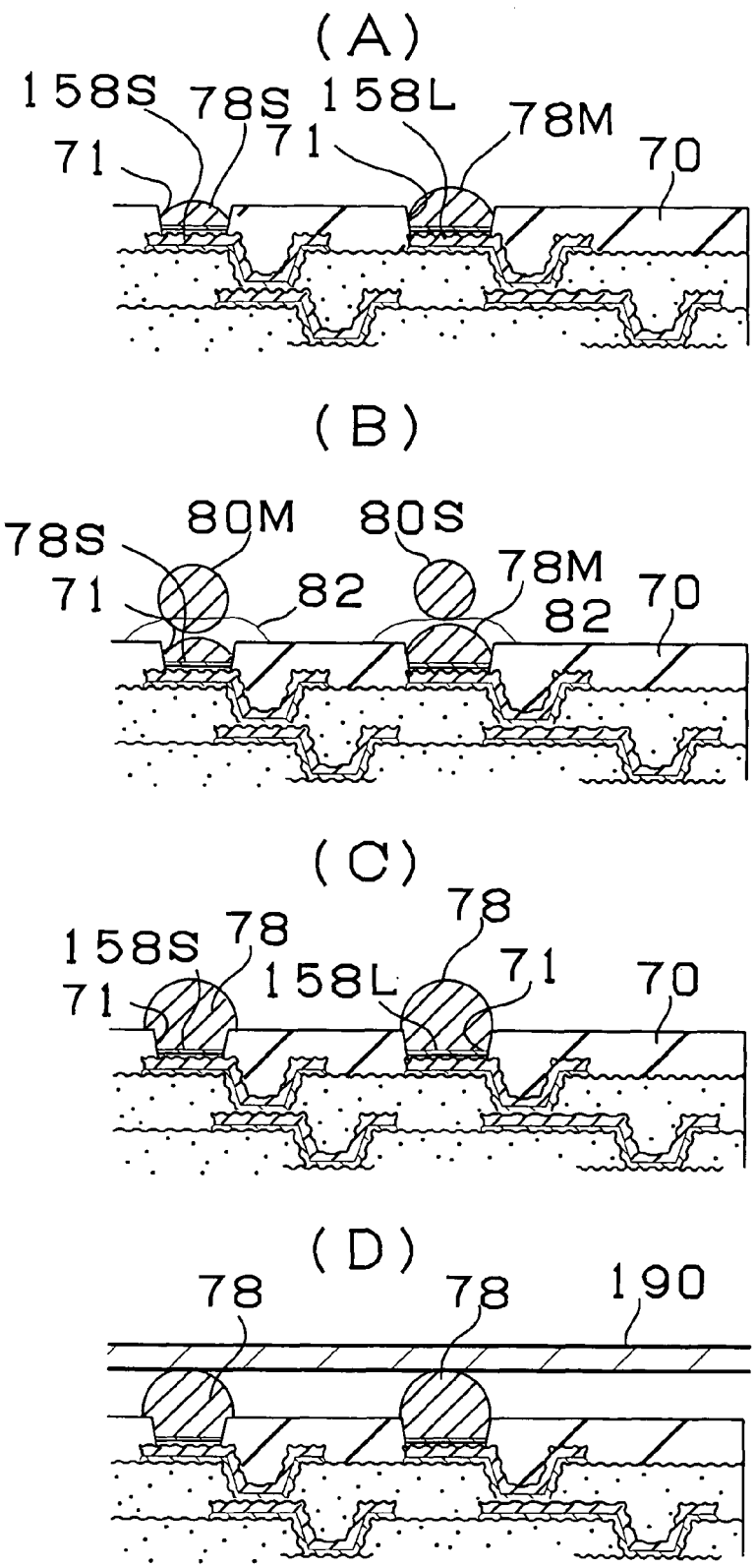
FIG. 15 is a process drawing showing a manufacturing method of multilayer printed wiring board according to a third embodiment.
Figure 16:
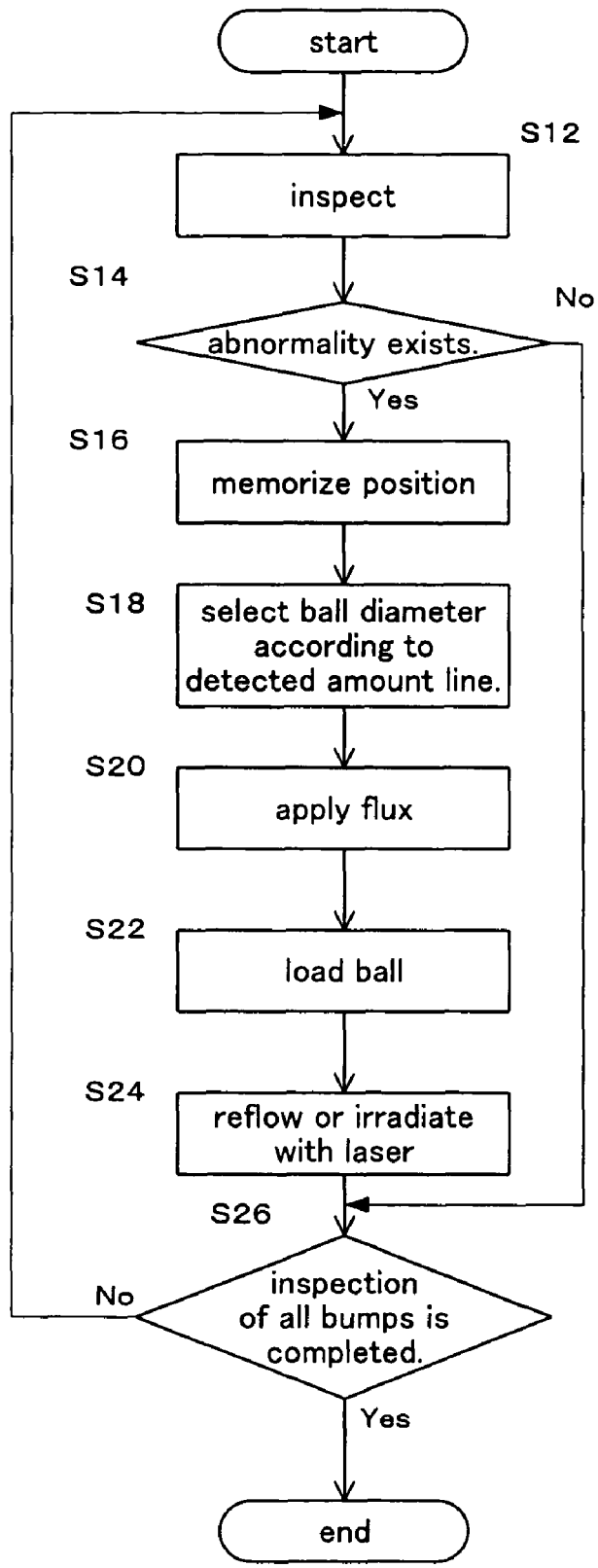
FIG. 16 is a flow chart showing correction processing of solder bump with the solder ball loading apparatus of the third embodiment.

The manufacturing process of this third embodiment will be described with reference to FIG. 15 and the flow chart of FIG. 16 showing its processing.

The solder bump is formed by reflow in the same manner as the first embodiment described above with reference to FIG. 4. If a solder bump 78S having a very small height is detected as a result of inspection (S12) as shown in FIG. 15(A) (S14: Yes), its position is memorized (S16) and whether the solder bump 78S exists in a relatively large diameter opening or a relatively small diameter opening is determined (in the same drawing, on the conductor pad 158S in the small diameter opening), and a solder ball 80M corresponding to the solder bump 78S is selected from the height of the solder bump 78S and the diameter of the conductor pad according to the detected amount line (S18). After being coated with flux (S20), the solder ball 80M is loaded on the solder bump 78S (FIG. 15(B)). Likewise, if a solder bump 78M having a slightly small height is detected as shown in FIG. 15(A) (S14: Yes), its position is memorized (S16) and the height of the solder bump 78M is measured in the same way as the solder bump 78S. Then, a corresponding relatively small solder ball 80S is selected (S18) and after being coated with flux (S20), the solder ball 80S is loaded on the solder bump 78M (FIG. 13(B)). Description of following processing is omitted because it is the same as the first embodiment. In the meantime, in the third embodiment, preferably, flattening is executed by further pressing a plate member 190 against the solder bump 78 adjusted in height (FIG. 15(D)).

According to the manufacturing method of printed wiring board of the third embodiment, the height of a detected low bump is measured and the diameter of solder ball necessary for adjusting the measured height to a required height is selected and loaded on that low bump based on the detected amount line by considering the diameter of the opening 71 in the solder resist layer. Thus, even if very low bumps and slightly low bumps coexist in openings of different diameters, the heights of all the bumps can be adjusted within the requested allowable range.

Fourth Embodiment

Subsequently, the manufacturing method of printed wiring board according to the fourth embodiment of the present invention will be described. According to the first-third embodiments, the solder bump is coated with flux and the solder ball is loaded thereon. Contrary to this, in the fourth embodiment, the solder ball is loaded without applying flux by providing the solder bump with a dent.

Figure 17:
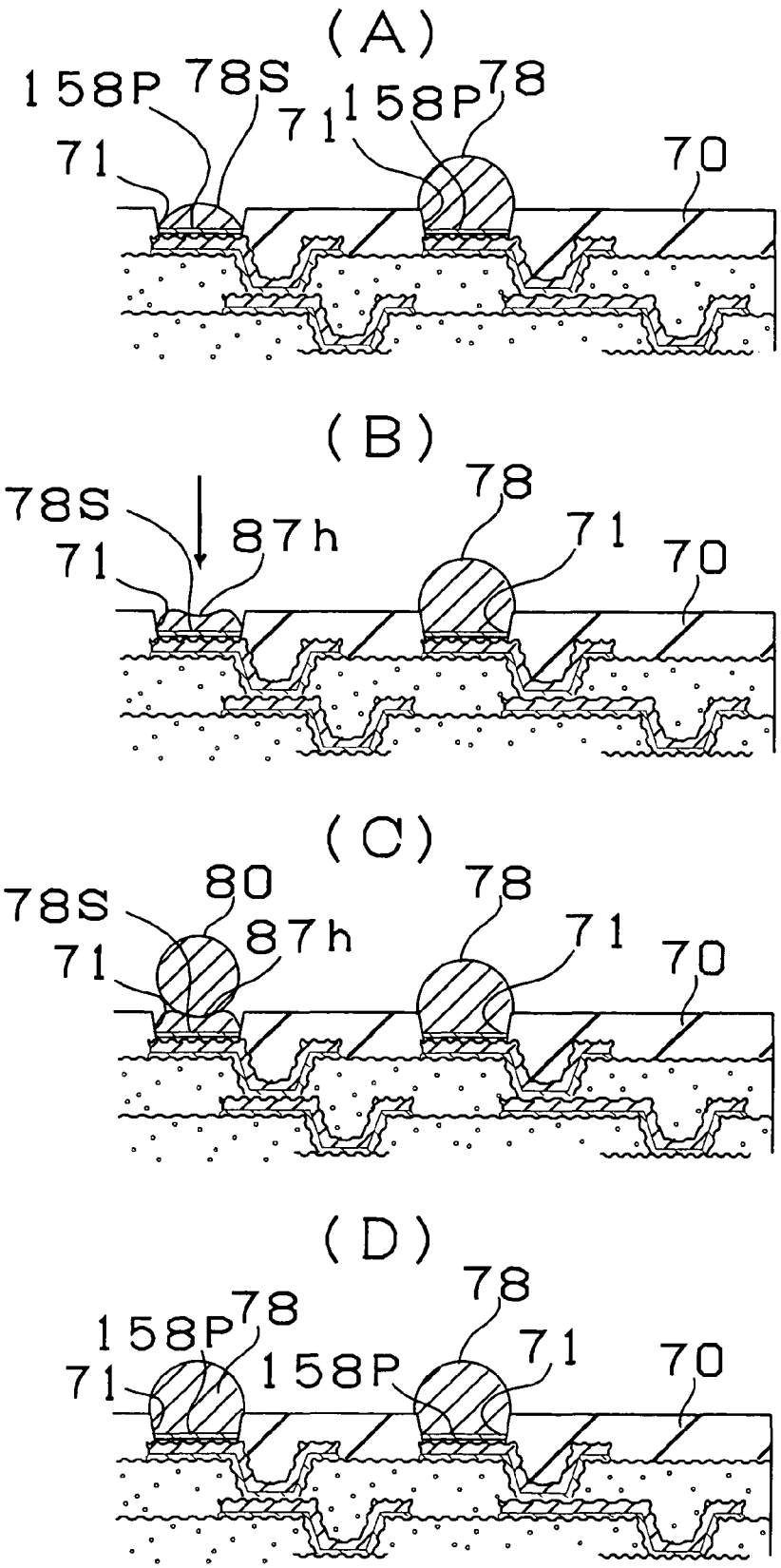
FIG. 17 is a process drawing showing manufacturing method of the multilayer printed wiring board of a fourth embodiment.

The manufacturing process of printed wiring board of the fourth embodiment will be described with reference to FIG. 17. If a solder bump 78 having a small height as shown in FIG. 17(A) is detected, a dent 87*h* is formed in the center by irradiating with laser as shown in FIG. 17(B). After that, the solder ball 80 is loaded in the dent 87*h* of the solder bump 78S (FIG. 17(C)) so as to intensify the height of the solder bump 78 by melting the solder ball with laser (FIG. 17(D)). Although the fourth embodiment utilizes laser, the dent may be formed by pressing a heated probe against the solder ball or bringing it near the solder ball. The fourth embodiment has such an advantage that the solder ball can be loaded at a very accurate position.

Fifth Embodiment

The structure of the solder ball loading apparatus 100 according to the fifth embodiment will be described with reference to FIG. 18(A). The solder ball loading apparatus 100 of the first embodiment described with reference to FIG. 3 has a loading cylinder 120 and a flux carrying cylinder 140. Contrary to this, the fifth embodiment has pluralities of the loading cylinders 120 and flux carrying cylinders 140. The fifth embodiment has such an advantage that the correction work can be done in a short time.

Sixth Embodiment

The structure of the solder ball loading apparatus 100 of the sixth embodiment will be described with reference to FIG. 18(B). In the solder ball loading apparatus 100 of the first embodiment described with reference to FIG. 3, flux is transferred by the flux carrying cylinder 140. Contrary to this, the sixth embodiment is so constructed that flux can be ejected from a front end of a flux carrying cylinder 140J. The sixth embodiment has such an advantage that the correction work can be done in a short time.

Although the above-described respective embodiments use Sn/Pb solder as the solder ball, Pb free solder selected from a group comprising Sn and Ag, Cu, In, Bi, Zn and the like may be used.

Although the invention has been disclosed in the context of a certain preferred embodiments, it will be understood that the present invention extends beyond the specifically disclosed embodiments to other alternative embodiments of the invention. Thus, it is intended that the scope of the invention should not be limited by the disclosed embodiments but should be determined by reference to the claims that follow.

What is claimed is:

1. A manufacturing method of printed wiring board comprising:
preparing a plurality of low melting point metal balls having different predetermined diameters;
supplying a low melting point metal to openings in a solder resist layer;
reflowing the low melting point metal to form reflowed bumps;
detecting a low bump from the reflowed bumps having a height lower than a specified height;
selecting a low melting point metal ball from the plurality of low melting point metal balls according a detected amount line indicating a relation between the reflowed bump heights before and after correction, wherein the detected amount line is created corresponding to different diameters of openings in the solder resist layer;
loading the low melting point metal ball onto the reflowed bump having a height lower than a specified height; and
correcting the height of the low reflowed bump by heating to melt the low melting point metal ball.

2. The manufacturing method of printed wiring board according to claim 1, wherein the detecting comprises computing the volume of the reflowed bump, and the selecting comprises selecting the low melting point metal ball having a diameter corresponding to a computed volume from the low melting point metal balls.

3. The manufacturing method of printed wiring board according to claim 2, wherein the computing is performed based on an equation, $V=4/3 \times \pi \times r \times r \times h \times \frac{1}{2}$, where the volume of the bump is V, a radius of the bump is r and a height of the bump from a conductor pad is h.

4. The manufacturing method of printed wiring board according to claim 1, wherein the detecting comprises measuring the height of the reflowed bump and, the selecting comprises selecting the low melting point metal ball having a diameter necessary for adjusting the height.

5. The manufacturing method of printed wiring board according to claim 1, further comprising coating the low melting point metal ball with a flux before the loading of the low melting point metal ball.

6. The manufacturing method of printed wiring board according to claim 5, wherein the flux has a viscosity higher than a viscosity of a flux applied before the low melting point metal is supplied to the openings in the solder resist layer.

7. The manufacturing method of printed wiring board according to claim 1, further comprising forming a dent on the low melting point metal ball before the loading of the low melting point metal ball on the bump.

8. The manufacturing method of printed wiring board according to claim 1, wherein the melting of the low melting point metal ball is carried out by heating with laser.

9. The manufacturing method of printed wiring board according to claim 1, wherein the selecting comprises selecting a low melting point metal ball from the plurality of low melting point metal balls also according to a volume of the reflowed bump.

* * * * *